United States Patent
Ren et al.

(10) Patent No.: US 9,438,255 B1
(45) Date of Patent: Sep. 6, 2016

(54) HIGH FREQUENCY DELAY LOCK LOOP SYSTEMS

(71) Applicant: Inphi Corporation, Santa Clara, CA (US)

(72) Inventors: Guojun Ren, San Jose, CA (US); James Gorecki, Santa Clara, CA (US); Karthik S. Gopalakrishnan, Santa Clara, CA (US)

(73) Assignee: INPHI CORPORATION, Santa Clara, CA (US)

( * ) Notice: Subject to any disclaimer, the term of this patent is extended or adjusted under 35 U.S.C. 154(b) by 0 days.

(21) Appl. No.: 14/815,694

(22) Filed: Jul. 31, 2015

(51) Int. Cl.
*H03L 7/06* (2006.01)
*H03L 7/085* (2006.01)

(52) U.S. Cl.
CPC .................................... *H03L 7/085* (2013.01)

(58) Field of Classification Search
USPC .................................. 327/147–149, 156–158
See application file for complete search history.

(56) References Cited

U.S. PATENT DOCUMENTS

| | | | |
|---|---|---|---|
| 7,336,752 B2 * | 2/2008 | Vlasenko | H03L 7/0814 327/147 |
| 7,705,644 B2 * | 4/2010 | Kim | H03L 7/10 327/149 |
| 2008/0238502 A1 * | 10/2008 | Song | H03K 3/0322 327/149 |
| 2010/0182057 A1 * | 7/2010 | Mei | H03L 7/0896 327/157 |
| 2013/0120036 A1 * | 5/2013 | Zhu | H03L 7/0805 327/156 |
| 2013/0271193 A1 * | 10/2013 | Keith | H03L 7/0812 327/158 |
| 2014/0118040 A1 * | 5/2014 | Nakayama | H03L 7/0816 327/157 |
| 2014/0292387 A1 * | 10/2014 | Dasgupta | H03L 7/095 327/157 |
| 2015/0130520 A1 * | 5/2015 | Matsuda | H03L 7/085 327/156 |
| 2015/0365071 A1 * | 12/2015 | Chang | H03H 7/19 327/156 |

* cited by examiner

*Primary Examiner* — Adam Houston
(74) *Attorney, Agent, or Firm* — Richard T. Ogawa; Ogawa P.C.

(57) ABSTRACT

The present invention is directed to signal processing system and electrical circuits. According to various embodiments, a DLL system includes a delay line provides multiple output signals associated with different clock phases. The delay line may be adjusted using a pair of bias voltages. A phase detector systems generates the bias voltages using the multiple output signals from the delay line. The multiple output signals include signals associated with the first phase, the last phase, and two adjacent phases. There are other embodiments as well.

20 Claims, 6 Drawing Sheets

| Proc | Voltage | Temp | 7GHz | | | | | 5GHz | | | | |
|---|---|---|---|---|---|---|---|---|---|---|---|---|
| | | | quadrature phase | | | output duty cycle | | quadrature phase | | | output duty cycle | |
| | | | 0-90 | 90-180 | 180-270 | 270-0 | clk0 | clk270 | 0-90 | 90-180 | 180-270 | 270-0 | clk0 | clk270 |
| top_tt | 0.95 | 110 | 35.70 | 36.01 | 36.19 | 34.96 | 49.7 | 50.1 | 49.90 | 50.24 | 50.22 | 49.64 | 49.8 | 50.4 |
| top_tt | 0.925 | 0 | 35.73 | 35.97 | 36.30 | 34.85 | 49.8 | 50.3 | 49.93 | 50.26 | 50.34 | 49.47 | 50.1 | 50.7 |
| top_tt | 0.925 | 125 | 35.72 | 36.05 | 36.19 | 34.90 | 49.6 | 50.0 | 49.93 | 50.27 | 50.22 | 49.58 | 49.8 | 50.3 |
| top_tt | 0.975 | 0 | 35.67 | 35.91 | 36.25 | 35.03 | 49.8 | 50.3 | 49.86 | 50.23 | 50.25 | 49.67 | 50.1 | 50.7 |
| top_tt | 0.975 | 125 | 35.69 | 36.00 | 36.18 | 34.99 | 49.6 | 49.9 | 49.88 | 50.22 | 50.20 | 49.70 | 49.7 | 50.2 |
| top_ss | 0.925 | 0 | 35.95 | 36.17 | 36.52 | 34.22 | 49.8 | 50.0 | 50.18 | 50.33 | 50.72 | 48.77 | 49.9 | 50.4 |
| top_ss | 0.925 | 125 | 35.87 | 36.32 | 36.33 | 34.33 | 49.7 | 49.9 | 50.06 | 50.43 | 50.43 | 49.08 | 49.8 | 50.3 |
| top_ss | 0.975 | 0 | 35.85 | 36.07 | 36.45 | 34.49 | 49.7 | 50.0 | 50.10 | 50.24 | 50.62 | 49.04 | 49.9 | 50.4 |
| top_ss | 0.975 | 125 | 35.79 | 36.19 | 36.28 | 34.60 | 49.7 | 49.9 | 50.01 | 50.34 | 50.37 | 49.27 | 49.8 | 50.3 |
| top_ff | 0.925 | 0 | 35.53 | 35.87 | 36.07 | 35.38 | 50.1 | 50.7 | 49.98 | 50.27 | 50.01 | 49.74 | 50.3 | 50.6 |
| top_ff | 0.925 | 125 | 35.56 | 35.90 | 36.06 | 35.34 | 49.3 | 49.7 | 49.80 | 50.25 | 49.95 | 50.00 | 49.4 | 49.8 |
| top_ff | 0.975 | 0 | 35.49 | 35.83 | 36.05 | 35.49 | 50.0 | 50.6 | 49.98 | 50.22 | 50.04 | 49.76 | 50.2 | 50.4 |
| top_ff | 0.975 | 125 | 35.52 | 35.86 | 36.06 | 35.42 | 49.2 | 49.6 | 49.81 | 50.23 | 49.90 | 50.06 | 49.2 | 49.6 |
| top_sf | 0.925 | 0 | 36.07 | 36.00 | 36.54 | 34.25 | 50.7 | 50.6 | 50.40 | 50.29 | 50.58 | 48.73 | 50.3 | 50.4 |
| top_sf | 0.925 | 125 | 36.00 | 36.15 | 36.40 | 34.30 | 50.6 | 50.5 | 50.23 | 50.37 | 50.42 | 48.98 | 50.2 | 50.3 |
| top_sf | 0.975 | 0 | 36.00 | 35.92 | 36.47 | 34.44 | 50.3 | 50.3 | 50.33 | 50.24 | 50.45 | 48.98 | 50.0 | 50.2 |
| top_sf | 0.975 | 125 | 35.95 | 36.09 | 36.38 | 34.44 | 50.4 | 50.3 | 50.16 | 50.31 | 50.38 | 49.15 | 50.0 | 50.1 |
| top_fs | 0.925 | 0 | 35.21 | 36.07 | 35.91 | 35.67 | 49.1 | 50.2 | 49.27 | 50.41 | 49.85 | 50.47 | 50.1 | 51.3 |
| top_fs | 0.925 | 125 | 35.30 | 36.05 | 35.86 | 35.64 | 48.5 | 49.5 | 49.46 | 50.29 | 49.86 | 50.38 | 49.2 | 50.3 |
| top_fs | 0.975 | 0 | 35.17 | 36.01 | 35.89 | 35.78 | 49.4 | 50.5 | 49.24 | 50.38 | 49.78 | 50.60 | 50.3 | 51.4 |
| top_fs | 0.975 | 125 | 35.28 | 35.99 | 35.87 | 35.71 | 48.6 | 49.6 | 49.43 | 50.23 | 49.86 | 50.47 | 49.3 | 50.3 |

Figure 5

HIGH FREQUENCY DELAY LOCK LOOP SYSTEMS

CROSS-REFERENCES TO RELATED APPLICATIONS

NOT APPLICABLE

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention is directed to signal processing system and electrical circuits.

Over the last few decades, we have witnessed a continued increase in processing power and speed of computing device and electronics. Machines are expected to perform a large number of operations quickly. Similarly, data are transferred at higher and higher speed. An important aspect of operating electronic devices and communication systems, especially in the digital domain, is to provide reference clock signal that provide coordination of various circuits. Without accurate and reliable clock signals, high speed computation and communication are not possible.

With complicated ICs operating at high speeds, it is important to provide mechanism to lock clock signals. Over the past, phase-locked loop (PLL) and delay-locked loop (DLL) have been used to provide synchronization. DLL systems are implemented using delay lines, as opposed to oscillator in PLL systems.

Over the past, various types of DLL systems have been proposed and implemented.

Unfortunately, existing DLL systems are often inadequate, especially in high speed operation. Therefore, new and improved DLL systems are desired.

BRIEF SUMMARY OF THE INVENTION

The present invention is directed to signal processing system and electrical circuits. According to various embodiments, a DLL system includes a delay line provides multiple output signals associated with different clock phases. The delay line may be adjusted using a pair of bias voltages. A phase detector systems generates the bias voltages using the multiple output signals from the delay line. The multiple output signals include signals associated with the first phase, the last phase, and two adjacent phases. There are other embodiments as well.

According to an embodiment, the present invention provides a delay-lock loop (DLL) system. The system includes a receiver interface for receiving a square clock signal, a first bias voltage and a second bias voltage. The system also includes an input conditioning module configured to maintain an edge shape of the clock signal. The system additionally includes a delay line comprising m delay modules arranged in series configured to generate n delayed signals. The system further includes an output driver coupled to the delay line and configured to generate n output signals. The n output signals include a first signal pair and a second signal pair. The first signal pair includes a first phase signal and a last phase signal. The second signal pair is associated a second phase signal and a third phase signal. The second phase signal has an adjacent phase relative to the third phase signal. The system also includes a phase detector that is configured to generate correction signal by at least comparing the first signal pair and the second signal pair. The system additionally includes a capacitor configured to for integrating the correction signal. The system further includes a bias voltage module configure to generate the first bias voltage and the second bias voltage using at least the correction signal. In various embodiments, the first bias voltage and the second bias voltage are equalized. The first bias voltage and the second bias voltage are an inverted pair. The phase detector comprises a first low-pass-filter for processing the first signal pair. The phase detector may also comprise an OTA. In an embodiment, n equals to 4 and the second phase signal and the third phase signal being separated by 90 degrees. According to an embodiment, the first phase signal is at phase 0 degree and the last phase signal is at phase 270 degrees. In various implementations, the phase detector comprises an AND gate coupled to the first signal pair. The input conditioning module comprises a delay tap, and n is associated with a predetermined number of phases. The output driver is AC coupled, which may be based on an output duty cycle. In various implementations, the output signals are coupled to an analog-to-digital converter (ADC). For example, the output signals correspond to n phases.

According to another embodiment, the present invention provides a receiver system. The system includes a PLL module configured to provide a reference clock signal. The system also includes a phase interpolator configured to generate a corrected clock signal based reference clock signal. The system further includes a delay lock loop (DLL) device comprising. The DLL includes a delay line comprising m delay modules arranged in series configured to generate n delayed signals based on a corrected clock signal and a pair of bias voltages, which include a first voltage and a second voltage. The DLL also includes an output driver coupled to the delay line and configured to generate n output signals, which include a first signal pair and a second signal pair. The first signal pair includes a first phase signal and a last phase signal. The second signal pair is associated a second phase signal and a third phase signal. The second phase signal has an adjacent phase relative to the third phase signal. The DLL further includes a phase detector that is configured to generate correction signal by at least comparing the first signal pair and the second signal pair. The phase detector has an OTA for comparing the first signal pair and the second signal pair. The DLL also includes a capacitor configured to for integrating the correction signal. The DLL additionally includes a bias voltage module configure to generate the first bias voltage and the second bias voltage using at least the correction signal.

According to yet another embodiment, the present invention provides a delay-lock loop (DLL) system that includes a delay line comprising m delay modules arranged in series configured to generate n delayed signals based on a reference clock signal and a pair of bias voltages. The pair of bias voltages includes a first voltage and a second voltage. The system also includes an output driver coupled to the delay line and configured to generate n output signals. The n output signals including a first signal pair and a second signal pair. The first signal pair includes a first phase signal and a last phase signal. The second signal pair is associated a second phase signal and a third phase signal. The second phase signal has an adjacent phase relative to the third phase signal. The system additionally includes a phase detector that is configured to generate correction signal by at least comparing the first signal pair and the second signal pair. The phase detector includes an OTA for comparing the first signal pair and the second signal pair. The phase detector includes a first AND gate for generating a first compare signal based on the first signal pair. The system further includes a bias voltage module that is configured to generate the first bias voltage and the second bias voltage using at least the correction signal. For example, The phase detector further includes a second AND gate for generating a second compare signal based on the second signal pair. The bias voltage module includes an equalizer for equalizing the first bias voltage and the second bias voltage.

It is to be appreciated that embodiments of the present invention provide many advantages over DLL conventional systems. For example, the phase correction techniques can vastly improve DLL performance and be conveniently implemented. The DLL systems according to embodiments of the present invention effectively address various issues, such as "fail to lock" and "stuck high" problems, that degrade performance of DLL systems. According to certain embodiments, phase correction techniques can be implemented in conjunction with existing DLL designs. Additionally, the embodiments of the present invention are compatible with existing and future devices and processes. For example, the offset correction mechanisms can be implemented using existing AND, NAND, and/or other types of logics and circuits. Furthermore, embodiments of the present invention can be used for high-speed applications, such as communication, computing, and/or other types of applications. There are other benefits as well.

BRIEF DESCRIPTION OF THE DRAWINGS

FIG. 5 is a table illustrating static phase offset and duty cycle of an exemplary implementation.

DETAILED DESCRIPTION OF THE INVENTION

Figure 1:
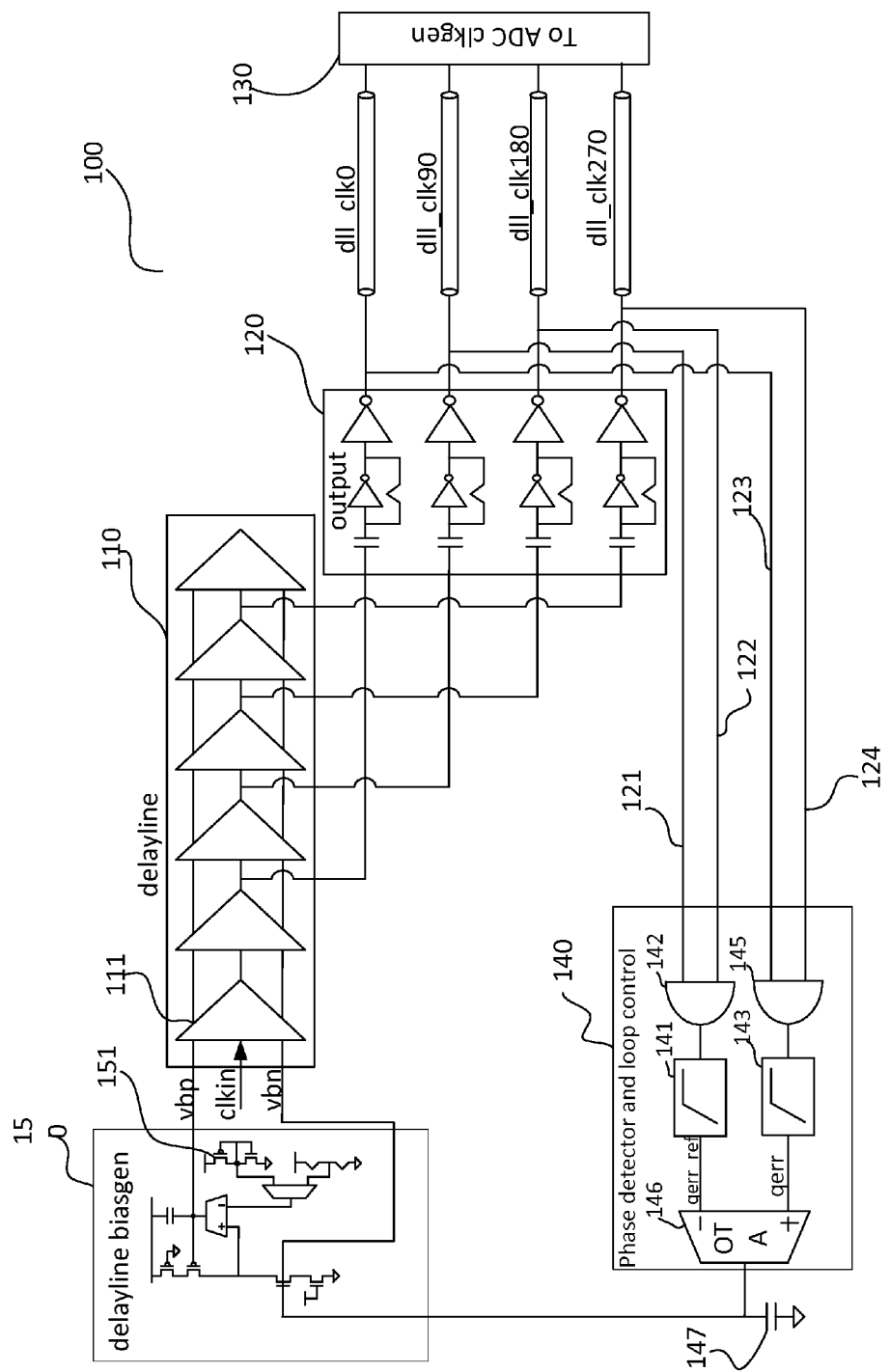
FIG. 1 is a simplified diagram illustrating a DLL system according to an embodiment of the present invention.

The present invention is directed to signal processing system and electrical circuits. According to various embodiments, a DLL system includes a delay line provides multiple output signals associated with different clock phases. The delay line may be adjusted using a pair of bias voltages. A phase detector systems generates the bias voltages using the multiple output signals from the delay line. The multiple output signals include signals associated with the first phase, the last phase, and two adjacent phases. There are other embodiments as well.

As explained above, DLL systems have many important applications. Among other things, DLL systems can operate at high speed, which can be used for high speed data communication, signal processing, computing, and other demanding applications. For example, the DLL systems and methods thereof implemented according to the present invention can operate at a clock frequency of over 1 GHz. As an example, a DLL can be used to change the phase of a clock signal, usually to enhance the clock rise-to-data output valid timing characteristics of ICs. To enhance clock signals, DLL systems themselves need to be accurate.

DLL systems are implemented with a plurality of delay lines. More specifically, the main component of a DLL system is a delay chain composed of many delay gates connected front-to-back. The input of the chain (and thus of the DLL) is connected to the clock that is to be delayed. A multiplexer is connected to each stage of the delay chain; the selector of this multiplexer is automatically updated by a control circuit to produce the delay effect. The output of the DLL is the resulting, delayed clock signal. From the outside, a DLL can be seen as a negative-delay gate placed in the clock path of a digital circuit. For example, a DLL system may have 2, 4, 8, or other numbers of delay lines (e.g., implemented using delay lines) that are serially connected. As a result, offset of delay lines would add to one another to cause a large offset for the DLL system. Typically, a DLL system needs to address various issues that might cause errors. One of the issues is DLL "false lock" issue, which typically happens when the system lock on to clock signals incorrectly, often with one or two cycles of delay. For example, when locking to a clock signal, the system may be in a locked, a lag state, or a lead state. When the system is in the locked state, the timing and the use of the clock signal take place correctly. However, when the system is in a lag state or a lead state, the system gets ahead or behind the clock signals, leading to system operating incorrectly.

In addition to the "false lock" issue described above, DLL systems operating at high frequencies often encounter an issues where systems is stuck at a "high" state during resetting processes, which may be referred to as a "stuck high" problem. The "stuck high" problem may be attributed to charge pump components of the DLL systems, and is especially problem in high-frequency operations. For example, in a conventional DLL systems that uses conventional charge pumps, "stuck high" issues often occurs when operating at high frequency (e.g., 1 GHz or higher), where PFD or PD internal reset path delay becomes a high portion of a clock period (i.e., clock period being relatively short when frequency is high). For example, offset of the charge pump (where charge pumped is implemented as a part of the DLL system) becomes a problem in high speed DLL systems. It is thus to be appreciated that embodiments of the present invention provide DLL systems that do not use charge pumps and substantially overcome "stuck high" issues described above.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

As explained above, for high frequency applications, it is often desirable for a DLL system to operate reliably and correctly. Among other things, the DLL system should be substantially free from "false lock", "stuck high", and other issues. It is to be appreciated that embodiments of the present invention, as described below, provide DLL architectures and methods of operating thereof that are capable of reliable operations and substantially free from "false lock", "stuck high" and other issues.

FIG. 1 is a simplified diagram illustrating a DLL system 100 according to an embodiment of the present invention. This diagram is merely an example, which should not unduly limit the scope of the claims. One of ordinary skill in the art would recognize many variations, alternatives, and modifications. The DLL system 100 includes a receiver interface 111, which is a part of the delay line 110, for receiving a square clock signal ("clkin"), a first bias voltage ("vbp") and a second bias voltage ("vbn"). As described in more details below, the first bias voltage and the second bias voltage are an inverted pair of voltage that helps lock the clock signal.

In various implementations, the DLL system 100 also includes an input conditioning module that is configured to maintain an edge shape of the clock signal. For example, the input conditioning module is implemented as a part of the delay line 110. Among other things, the input conditioning module ensures that the shape of the clock signal is consistent. More specifically, the square clock signal received as the input comprises a square wave with rising and falling edges. Depending on the implementation, the rising edge and/or falling edges may be used. The system 100 uses all rising edges or all falling edges. For example, when using the rising edge of the 90 degree phase, the system also uses the rising edge of the 270 degree phase; when using the falling edge of the 90 degree phase, the system also uses the falling edge of the 270 degree phase. In various implementations, the input conditioning module comprises a delay tap that conditions the edges of the cock signal that help maintain the phase consistency so that the clock signal is not edge dependent.

Figure 2:
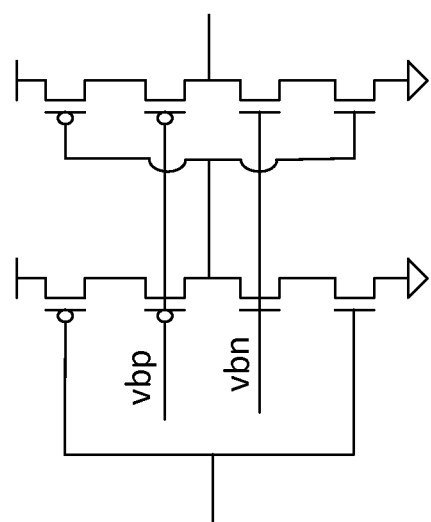
FIG. 2 is a simplified diagram illustrating a delay cell according to an embodiment of the present invention.

The delay line 110 includes m delay modules arranged in series configured to generate n delayed signals. As shown in FIG. 1, the delay 110 includes 6 delay modules (i.e., m=6) and it generates 4 delayed signals (i.e., n=4). Among other things, the number of delay module is predetermined based on the number of phases to be provided. The delay line 110 in FIG. 1 generates for delayed signals, each carrying ¼ phase of a clock cycle. FIG. 2 is a simplified diagram illustrating a delay cell according to an embodiment of the present invention. This diagram is merely an example, which should not unduly limit the scope of the claims. One of ordinary skill in the art would recognize many variations, alternatives, and modifications. As shown in FIG. 2, each of the delay cells uses the clock signal received from the input. The bias voltages pair "vbp" and "vbn" are used to control the transistor gates of the delay cell. By setting the bias voltages using the phase detector 140 and bias voltage module 150, the clock signal is adjusted as a part of the feedback loop shown in FIG. 1. In various embodiments, the bias voltage module 150 is specifically configured to equalize rising and falling edges, and to maintain duty cycle with the outputs. Depending on the implementation, the bias voltage module 150 may be implemented in other ways. For example, the bias voltage module 150 can be implemented using a pair of transistors, one provides vbp, and the other provides vpn. Among other components, the bias voltage module 150 includes a trip point switch, which provides equalization of falling and rising edges, and thus enhancing system performance.

Now referring back to FIG. 1. The outputs of the delay line 110 are coupled to the output driver 120. For example, the output driver 120 includes n outputs for providing n output signals. The n number of output signals corresponds to the n delayed signals from the delay line 110. Each of the n output signal corresponds to a clock phase. As an example, FIG. 1 shows a system with 4 output signals, and the phases of the 4 output signals are thus 0 degree, 90 degrees, 180 degrees and 270 degrees. For a system with 8 output signals and thus 8 phases, the phases of the 8 output signals would be 0 degree, 45 degrees, 90 degrees, 135 degrees, 180 degrees, 225 degrees, 270 degrees, and 315 degrees. And so forth and so on. As shown in FIG. 1, the output driver 120 comprises n (i.e., 4 in this exemplary system) output lines, each of which comprises diodes and capacitors as shown. It is to be appreciated that depending on the application, the output driver 120 may be implemented in other ways as well.

It is to be appreciated that a similarly structured phase detector 140 and bias voltage module can be used with various types of delay lines. As shown in FIG. 1, the phase detector 140 processes two pair of inputs. A first pair of inputs is selected between two adjacent delay modules (i.e., adjacent phases), and a second pair of input is selected between the first and last delay modules (i.e., the first and the last phase). While the delay line, depending on the specific implementation, may have different number of modules, inputs for the phase detector 140 remain at two pairs. The configuration and structure of the phase detector 140 may be substantially the same, regardless of the number of delay modules in the delay line. Similarly, the bias voltage module 150 receives input from the phase detector 140, and the structure of the bias voltage module 150 may be substantially the same, regardless of the number of delay modules in the delay line. It is thus to be appreciated that embodiments of the present invention can be applied to various types of DLLs with different number of delay modules.

The output signals from the output driver 120 is fed to both an output device 130 and the phase detector 140. In FIG. 1, the output device 130 comprises an analog to digital converter (ADC) device. For example, the ADC device comprises a successive approximation register (SAR) based ADC. It is to be understood that the output device 130 can be other types of devices as well.

The output signals of the output driver 120 is also used by the phase detector 140 to generate a correction signal that is to adjust the output signals at the delay line 110. The phase detector to work, the phase detector 140 needs two pairs of signals. A first pair of signals includes the first phase signal 121 and the last phase signal 122. For example, the first phase signal 121 is associated with the first clock signal at 0 degree. The last phase signal 122 is associated with the last clock signal at 270 degrees. It is to be appreciated that the difference between the first phase signal 123 and the last phase signal 124 is associated with an accumulated offset. For example, the difference between the signals 123 and 124 is indicative of the total amount correction that is needed for an entire clock period. Therefore, the first pair of signals consisting of signals 123 and 124 is associated with an accumulated offset.

A second pair of signals is provided as a set of reference signals. That is, the phase difference between the output signals of adjacent phases reflects the phase difference that is inherent to all adjacent phase pairs. In FIG. 1, the second pair of signals comprises signals 121 and 122, which respectively are output signals for output signals at phases 90 degrees and 180 degrees. It is to be understood that other two signals pair consisting of signals of adjacent phases can be used as well. For example, the second pair of signals may also take from output signal pair at 0 degree and 90 degrees, or output signal pair at 180 degrees and 270 degrees. For example, for a system with 8 output signals where each two adjacent signals are 45 degrees apart, a set of reference signals can be selected from adjacent signal pairs 45 degrees and 90 degrees, adjacent signal pairs 135 degrees and 180 degrees, etc. As explained above, the system 100 can be configured to operate with different number of delay modules, which translates to fewer or more output signals.

By using the AND gate 142, the overlapping "on" portion between the signals 121 and 122 is obtained, which is used as a reference signal. That is, the reference signal indicates a typical overlap between a pair of reference signals with adjacent phases. The AND gate 145 provides an overlap between signals 123 and 124, which is a difference between the first and the last phases, reflecting an accumulated phase difference for an entire clock cycle. Filters 141 and 143 are provided to filter out a portion of signal. For example, filters 141 and 143 comprise low-pass filters (looking from right to left). Among other things, the low-pass filters extract DC information that is related to the delay line. The filtered output of the AND gates 145 and 142 are then compared by the operational transconductance amplifier (OTA) 146, which outputs a correction signal. For example, the OTA 146 processes the output of the filters 141 and 143 as a pair of differential input voltages, and generates an output current that is supplied to the bias voltage module 150. The OTA 146 is characterized by an amplifier transconductance, and the output current can be determined by the difference between the differential input voltages and the amplifier transconductance. The capacitor 147 is coupled to the OTA 146 and integrates the output (i.e., correction signal) generated by the OTA 146.

The correction signal (e.g., an output current) generated by the phase detector 140 and integrated by the capacitor 147 is then used by the bias voltage module 150 to generate bias voltages "vbp" and "vbn" for correcting the clock signal at the delay line 110. In various embodiments, the module 150 generates bias voltages with equalized delay line rising edges or falling edges.

Figure 3:
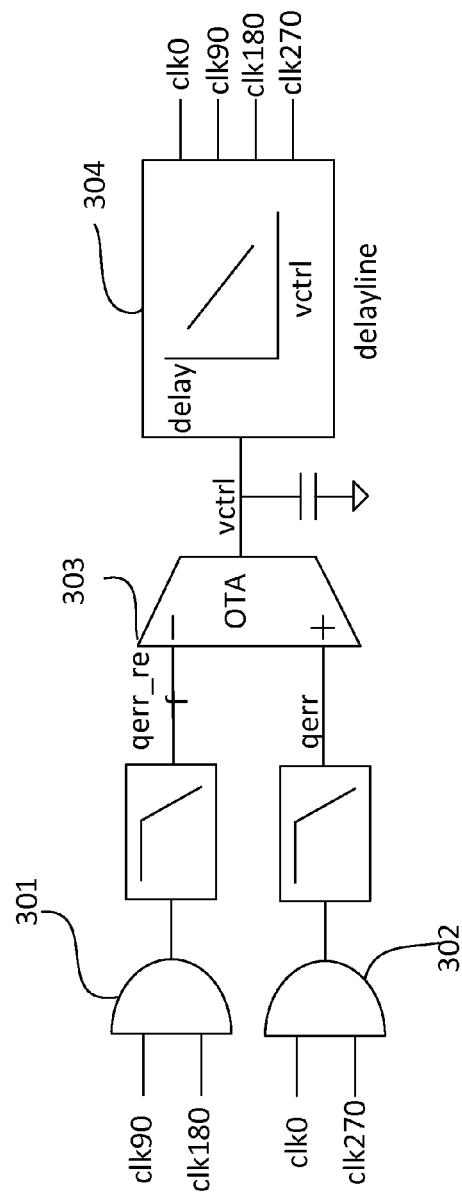
FIG. 3 is a simplified diagram illustrating a phase detector module according to an embodiment of the present invention.

FIG. 3 is a simplified diagram illustrating a phase detector module according to an embodiment of the present invention. This diagram is merely an example, which should not unduly limit the scope of the claims. One of ordinary skill in the art would recognize many variations, alternatives, and modifications. As shown in FIG. 3, clk90 and clk180 signals are used by a first AND gate 301 to generate a reference signal "qerr_ref". The reference signal qerr_ref provides a reference point of difference between two phases (here, the difference between output signals associated with phase 90 degrees and 180 degrees). The second AND gate 302 uses clk0 and clk270 signals to generate a signal "qerr", which is associated with the accumulated differences between the output signals corresponding to the first and last phases. The OTA 303 generates a control signal that is later provided to the delay line 304.

Figure 4:
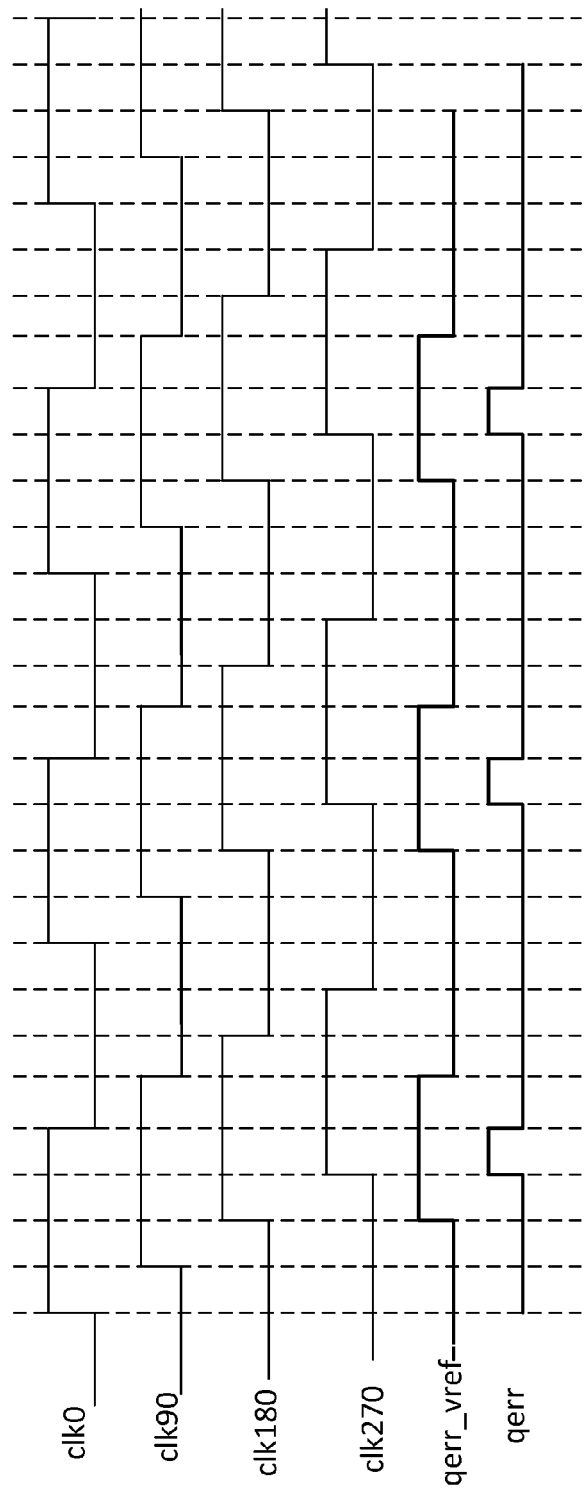
FIG. 4 is a timing diagram illustrating operation a phase detector module according to an embodiment of the present invention.

FIG. 4 is a timing diagram illustrating operation a phase detector module according to an embodiment of the present invention. This diagram is merely an example, which should not unduly limit the scope of the claims. One of ordinary skill in the art would recognize many variations, alternatives, and modifications. For example, the signals in FIG. 4 correspond to the signals at the phase detector illustrated in FIG. 3.

FIG. 5 is a table illustrating static phase offset and duty cycle of an exemplary implementation. This diagram is merely an example, which should not unduly limit the scope of the claims. One of ordinary skill in the art would recognize many variations, alternatives, and modifications. For example, the underlying DLL system operates with four phases, and respectively at 7 GHz and 5 GHz. It is to be appreciated that embodiments of the present invention is especially effective in high frequency systems.

Figure 6:
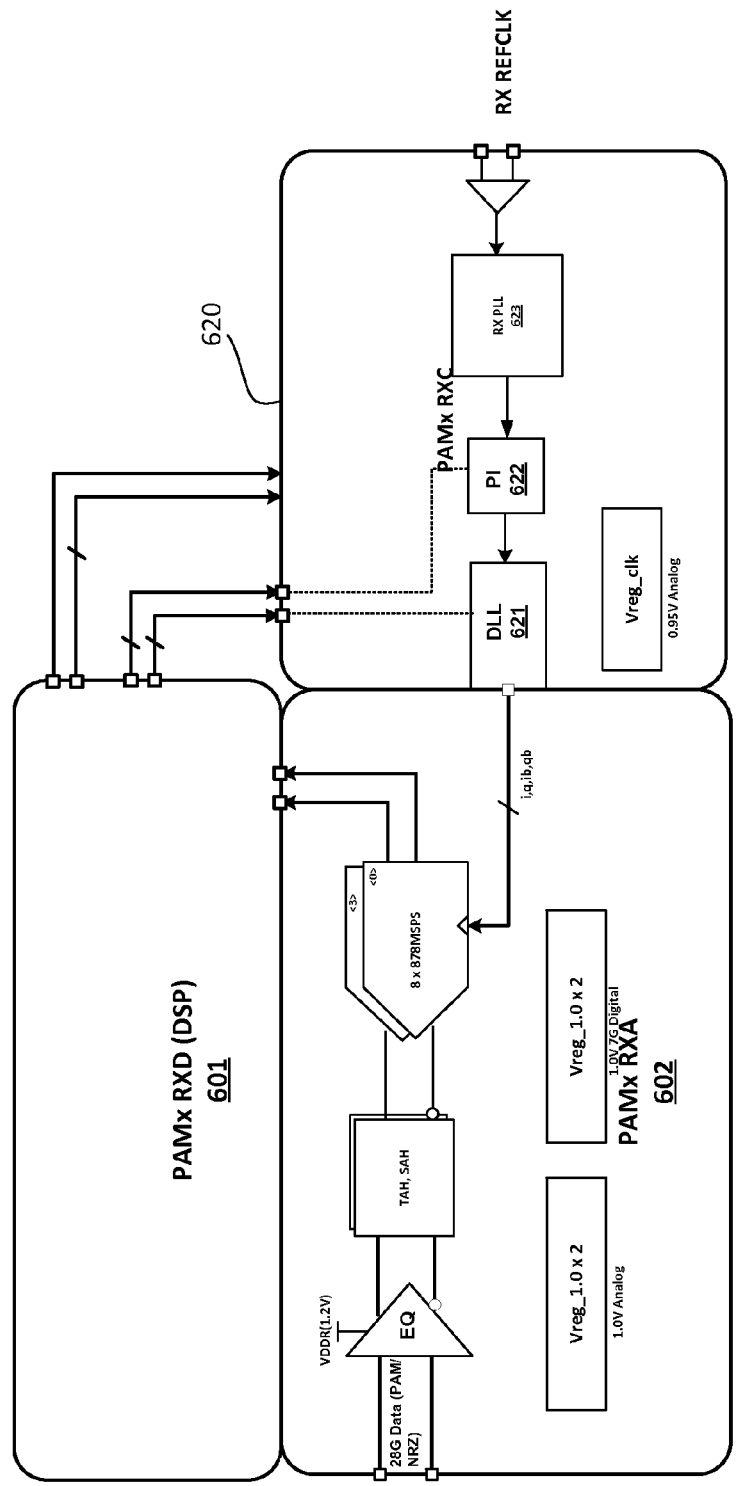
FIG. 6 is a simplified diagram illustrating a pulse amplified modulated (PAM) system configured with a DLL according to an embodiment of the present invention.

FIG. 6 is a simplified diagram illustrating a pulse amplified modulated (PAM) system configured with a DLL according to an embodiment of the present invention. This diagram is merely an example, which should not unduly limit the scope of the claims. One of ordinary skill in the art would recognize many variations, alternatives, and modifications. As shown, the block diagram has a digital signal processor (DSP) 601 coupled a DLL 621 and a phase interpolator (PI) 622, which are parts of the receiver module 620. The phase lock loop (PLL) 623 is configured as a frequency synthesizer to provide a reference clock signal (RX REFCLK) to a timing recovery loop. The PLL 623 provides a reference clock signal to the PI 622, which provides clock signal to the DLL 621. For example, the DLL 622 is implemented according to DLL 100 illustrated in FIG. 1. The DLL 622 is configured to generate clock signals at different phases (e.g., i, q, ib, qb). The DSP module 601 is configured to provide a timing recovery loop that drives PI 622 and the DLL 621 to track certain ppm frequency offset and phase locking between data and DLL output clocks. In various embodiments, the DLL 622 includes, among other components, a delay line and a phase detector that provides offset correction.

As mentioned above, embodiments of the present invention provide many performance advantages over conventional systems. Compared to existing DLL systems that are implemented with charge pumps, embodiments of the present invention provide improved offset correction technique, which among other things address "stuck high" problem in high frequency systems. There are other benefits as well.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A delay-lock loop (DLL) system comprising:
   a receiver interface for receiving a square clock signal, a first bias voltage and a second bias voltage;
   an input conditioning module configured to maintain an edge shape of the clock signal;
   a delay line comprising m delay modules arranged in series configured to generate n delayed signals;
   an output driver coupled to the delay line and configured to generate n output signals, the n output signals including a first signal pair and a second signal pair, the first signal pair including a first phase signal and a last phase signal, the second signal pair being associated a second phase signal and a third phase signal, the second phase signal having an adjacent phase relative to the third phase signal;
   a phase detector being configured to generate correction signal by at least comparing the first signal pair and the second signal pair;
   a capacitor configured to for integrating the correction signal; and
   a bias voltage module configure to generate the first bias voltage and the second bias voltage using at least the correction signal.

2. The system of claim 1 wherein the first bias voltage and the second bias voltage are equalized.

3. The system of claim 1 wherein the first bias voltage and the second bias voltage are an inverted pair.

4. The system of claim 1 wherein the phase detector comprises a first low-pass-filter for processing the first signal pair.

5. The system of claim 1 wherein the phase detector comprises an operational transconductance amplifier.

6. The system of claim 1 wherein the n equals to 4 and the second phase signal and the third phase signal being separated by 90 degrees.

7. The system of claim 1 wherein the first phase signal is at phase 0 degree and the last phase signal is at phase 270 degrees.

8. The system of claim 1 wherein the phase detector comprising an AND gate coupled to the first signal pair.

9. The system of claim 1 wherein the input conditioning module comprises a delay tap.

10. The system of claim 1 wherein the edge shape is substantially vertical.

11. The system of claim 1 wherein n is associated with a predetermined number of phases.

12. The system of claim 1 wherein the output driver is AC coupled.

13. The system of claim 1 wherein the output driver is AC coupled based on an output duty cycle.

14. The system of claim 1 wherein the output signals are coupled to an analog-to-digital converter (ADC).

15. The system of claim 1 wherein the output signals correspond to n phases.

16. A receiver system comprising:
    a PLL module configured to provide a reference clock signal;
    a phase interpolator configured to generate a corrected clock signal based reference clock signal; and
    a delay lock loop (DLL) device comprising:
      a delay line comprising m delay modules arranged in series configured to generate n delayed signals based on a corrected clock signal and a pair of bias voltages, the pair of bias voltages including a first voltage and a second voltage;
      an output driver coupled to the delay line and configured to generate n output signals, the n output signals including a first signal pair and a second signal pair, the first signal pair including a first phase signal and a last phase signal, the second signal pair being associated a second phase signal and a third phase signal, the second phase signal having an adjacent phase relative to the third phase signal;
      a phase detector being configured to generate correction signal by at least comparing the first signal pair and the second signal pair, the phase detector comprising an OTA for comparing the first signal pair and the second signal pair;
      a capacitor configured to for integrating the correction signal; and
      a bias voltage module configure to generate the first bias voltage and the second bias voltage using at least the correction signal.

17. The system of claim 16 further comprising a digital signal processor configured to provide time recovery information to the phase interpolator and the DLL.

18. A delay-lock loop (DLL) system comprising:
    a delay line comprising m delay modules arranged in series configured to generate n delayed signals based on a reference clock signal and a pair of bias voltages, the pair of bias voltages including a first voltage and a second voltage;
    an output driver coupled to the delay line and configured to generate n output signals, the n output signals including a first signal pair and a second signal pair, the first signal pair including a first phase signal and a last phase signal, the second signal pair being associated a second phase signal and a third phase signal, the second phase signal having an adjacent phase relative to the third phase signal;
    a phase detector being configured to generate correction signal by at least comparing the first signal pair and the second signal pair, the phase detector comprising a OTA for comparing the first signal pair and the second signal pair, the phase detector comprising a first AND gate for generating a first compare signal based on the first signal pair; and
    a bias voltage module configure to generate the first bias voltage and the second bias voltage using at least the correction signal.

19. The system of claim 18 wherein the phase detector further comprising a second AND gate for generating a second compare signal based on the second signal pair.

20. The system of claim 18 wherein the bias voltage module comprises an equalizer for equalizing the first bias voltage and the second bias voltage.

* * * * *